(12) United States Patent
Kennon et al.

(10) Patent No.: US 6,674,432 B2
(45) Date of Patent: Jan. 6, 2004

(54) METHOD AND SYSTEM FOR MODELING GEOLOGICAL STRUCTURES USING AN UNSTRUCTURED FOUR-DIMENSIONAL MESH

(75) Inventors: Stephen R. Kennon, Austin, TX (US); Scott A. Canann, Austin, TX (US); Steven B. Ward, Austin, TX (US)

(73) Assignee: Object Reservoir, Inc., Austin, TX (US)

( * ) Notice: Subject to any disclaimer, the term of this patent is extended or adjusted under 35 U.S.C. 154(b) by 306 days.

(21) Appl. No.: 09/896,104

(22) Filed: Jun. 29, 2001

(65) Prior Publication Data
US 2002/0050993 A1 May 2, 2002

Related U.S. Application Data
(60) Provisional application No. 60/215,697, filed on Jun. 29, 2000.

(51) Int. Cl.[7] ............................................... G06T 15/00
(52) U.S. Cl. ........................................ 345/419; 345/420
(58) Field of Search ................................ 345/419, 420, 345/423, 441, 619, 723, 733, 734, 751, 756; 716/20; 706/45, 49; 382/128, 154; 709/107, 204, 231

(56) References Cited

U.S. PATENT DOCUMENTS

| | | | | |
|---|---|---|---|---|
| 5,572,634 A | * | 11/1996 | Duluk, Jr. | 345/419 |
| 5,675,521 A | * | 10/1997 | Holzhauer et al. | 716/20 |
| 6,552,724 B1 | * | 4/2003 | Marshall | 345/420 |
| 6,587,104 B1 | * | 7/2003 | Hoppe | 345/423 |
| 6,608,628 B1 | * | 8/2003 | Ross et al. | 345/619 |

OTHER PUBLICATIONS

Freitag et al., "Unstructured Meshes and Parallel Adaptive Techniques", 1998.*

* cited by examiner

Primary Examiner—Mark Zimmerman
Assistant Examiner—Lance W. Sealey
(74) Attorney, Agent, or Firm—Gray Cary Ware & Freidenrich, LLP (57) ABSTRACT

A method for solving space-time problems involving three-dimensional space wherein an unstructured four-dimensional finite element model is generated and solved to produce a four-dimensional solution. The four-dimensional mesh is generated from a three-dimensional mesh by extruding each of the simplices of the three-dimensional mesh in a time dimension. The four-dimensional prisms formed by extrusion of the three-dimensional simplices are divided into a plurality of four-dimensional simplices which form a four-dimensional finite element model. The elements of the four-dimensional model can be selectively refined to obtain a finer mesh in areas of greater interest, and a coarser mesh in areas which are of less interest. The mesh can be refined in the spatial dimensions and also in the temporal dimension.

32 Claims, 9 Drawing Sheets

METHOD AND SYSTEM FOR MODELING GEOLOGICAL STRUCTURES USING AN UNSTRUCTURED FOUR-DIMENSIONAL MESH

RELATED APPLICATIONS

This application claims priority under 35 U.S.C. §119(e) to U.S. Patent Application No. 60/215,697 entitled "Method and System for Oil Reservoir Simulation and Modeling" by Stephen R. Kennon, Kok Thye Lim, Scott A. Canaan, Steven B. Ward, Stuart W. Pond, Jr. and Edward J. Barragy, filed Jun. 29, 2000, which is incorporated by reference as if set forth in its entirety herein.

TECHNICAL FIELD OF THE INVENTION

This invention relates generally to methods and systems for modeling physical systems using the finite element method and, more specifically, to methods and systems for creating finite element models for simulating underground reservoirs and corresponding fluid flow, especially in hydrocarbon reservoirs.

BACKGROUND OF THE INVENTION

Physical systems can be modeled mathematically to simulate their behavior. There are a wide variety of means to model these systems, ranging from the very simplistic to the extremely complicated. One of the more complicated means to model physical systems is through the use of the finite element method (FEM). As the name implies, the finite element method involves the representation of individual, finite elements of the physical system in a mathematical model and the solution of this model in the presence of a predetermined set of boundary conditions.

In finite element modeling, the region that is to be analyzed is broken up into sub-regions called elements. This process of dividing the region into sub-regions may be referred to as discretization or mesh generation. The region is represented by functions defined over each element. This generates a number of local functions that are much simpler than those which would be required to represent the entire region. The next step is to analyze the response for each element. This is accomplished by building an element matrix and vector for each element in the system. The element matrix defines the properties of the element within the region, while its vector defines the forces acting on the element. Once all the element matrices and vectors have been created, they are combined into a structure matrix equation. This equation relates nodal responses for the entire structure to nodal forces. Nodes are specific locations in the model which are used as the corners or vertices of the elements. After applying boundary conditions which are constraints on the solution by predetermined properties of the models, the structure matrix equation can be solved to obtain unknown nodal responses. Intra-element responses can be interpolated from nodal values using the functions which were defined over each element.

Figure 1:
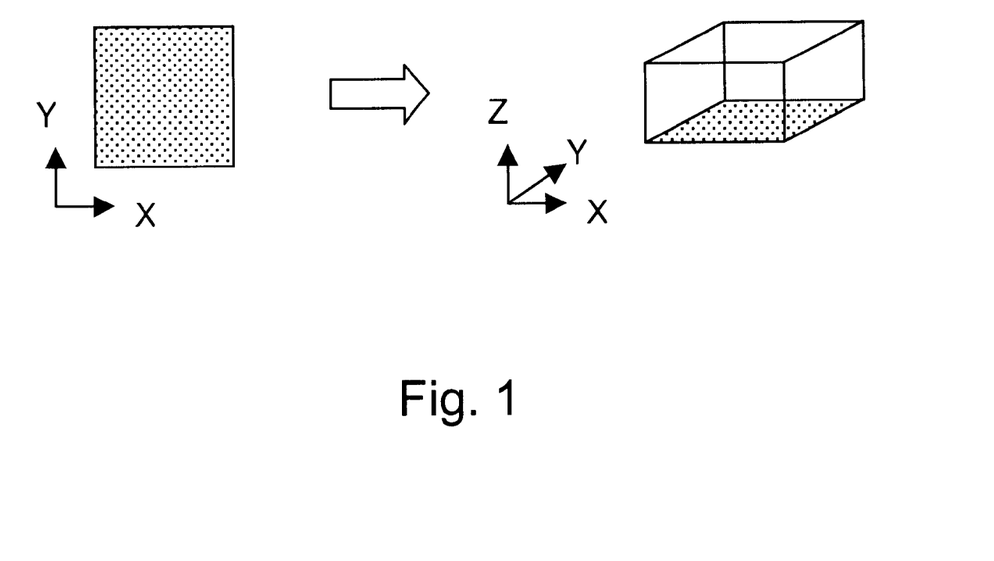
FIG. 1 is an illustration of the rectangular and hexahedral elements which comprise structured finite element meshes in the prior art.

As indicated above, finite element modeling involves the creation of a mesh of finite elements. The elements are defined by nodes within the problem space, which may be 1-, 2-, 3- or higher dimensioned. The nodes are simply points in space. The lines between the nodes are referred to as "edges." The mesh is typically a structured mesh. In other words, for a mesh defined in three dimensions, the elements within the problem space are hexahedrons. For example, they may be cubes or rectangular prisms. (Equivalently, in two dimensional problems, the elements would be rectangles—see FIG. 1 for an illustration of these elements.) The edges of the hexahedrons are coincident with the edges between the nodes of the mesh. In a simple model, the nodes of the mesh may be regularly spaced to define cubic elements. It is not necessary, however, for the nodes to be evenly spaced in all finite element models. A variety of different sizes and shapes of hexahedral elements can be defined within a single mesh. Smaller elements are typically used to more accurately capture physical phenomena in a local region or to better model the physical shape.

One of the problems with meshes which use hexahedral elements is that they do not lend themselves well to complex geometries which may need to be modeled. In other words, it may be difficult to place nodes sufficiently close to irregular surfaces to accurately determine the solution to the problem along those surfaces. Viewed another way, it is difficult to fill an irregularly shaped object with regularly shaped boxes. This situation is further complicated by limitations on the minimum distance between nodes in a structured mesh. Even when additional nodes (and thus elements) can be defined in the mesh to improve the accuracy of the model, the inclusion of these additional elements causes the resources needed to solve the resulting model to rapidly increase.

These problems are compounded with each additional dimension of the problem. Because of the computational resources required in prior art structured models, inclusion of a time dimension into a single, structured four-dimensional model is impractical. This is true because meshes made up of hexahedral elements cannot be easily locally refined in size. Consequently, when a solution to a structured three-dimensional model over time is desired, the model must be solved at a first time, then again at a second time, and so on, until a series of time steps covering the desired range is completed. If it is desired to model a temporal feature more accurately, this must be achieved by decreasing the size of the time steps and computing the entire three-dimensional physical model for a greater number of time values. The computing resources which are required to generate the solution obviously increases with the smaller time steps. There is no way to localize the smaller time steps to a particular physical volume of interest.

SUMMARY OF THE INVENTION

One or more of the problems outlined above may be solved by the various embodiments of the invention. Broadly speaking, the invention comprises a method for solving space-time problems involving three-dimensional space by constructing and solving an unstructured four-dimensional finite element model. This method may provide a number of advantages over prior art methods, including "free" mesh generation, faster and easier generation of solutions for the space-time model, elimination of the need for a four-dimensional mesher, and accurate modeling of irregular spatial and temporal features.

In one embodiment, the method comprises providing a three-dimensional mesh which models the system to be solved and extruding the three-dimensional mesh to form a four-dimensional mesh. Both the three-dimensional mesh and the resulting four-dimensional mesh are unstructured. That is, they are not constrained to use hexahedral elements and are not subject to the limitations associated with the use of these elements. The three-dimensional and four-dimensional meshes in the present method comprise elements which are simplices in three-dimensional and four-dimensional space, respectively. The use of simplex elements allows the models to more accurately match the spatial and temporal shape of the modeled system than is possible using a structured mesh of hexahedral elements.

The four-dimensional mesh is generated from a three-dimensional mesh by extruding each of the simplices of the three-dimensional mesh in a fourth dimension (time.) The extrusion creates a four-dimensional prism from each of the three-dimensional simplices. These four-dimensional prisms are then divided into several four-dimensional simplices. This process is repeated until the newly generated four-dimensional simplices cover the desired time range. The newly generated four-dimensional simplices form a four-dimensional finite element model. The elements of this model can be selectively adjusted to obtain a finer mesh in areas of greater interest, and a coarser mesh in areas which are of less interest. The mesh can be refined in the spatial dimensions and, unlike time-stepped models, it can also be easily refined in the temporal dimension. The refined four-dimensional mesh may therefore be substantially simplified (i.e., unneeded elements can be eliminated or collapsed into other elements) so that fewer computing resources are required to generate a solution for the model. (It should be noted that the three-dimensional mesh can be generated from a two-dimensional mesh in the same way the four-dimensional mesh is extruded from the three-dimensional mesh.)

In one embodiment, the extrusion process proceeds as follows. (Because the process is useful to extrude from two dimensions to three, as well as from three dimensions to four, the description will be generalized to extrusion from n dimensions to n+1.) First, the original, n-dimensional mesh is duplicated and the duplicate is displaced in the n+1 dimension. Each node is connected to its duplicate by an edge. The combination of the existing edges and the newly formed edges define an n+1-dimensional prism corresponding to each of the original simplices. Then, for each prism, the node number for each of the nodes in the original n-dimensional simplex is identified. Based upon the ordering of the nodes (i.e., whether the first node is numerically higher or lower than the second node,) a bit pattern is generated. This bit pattern is used as an index to a lookup table that contains the combinations of the nodes that form the vertices of each of the new n+1-dimensional simplices.

BRIEF DESCRIPTION OF THE DRAWINGS

Other objects and advantages of the invention may become apparent upon reading the following detailed description and upon reference to the accompanying drawings in which.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the spirit and scope of the present invention as defined by the appended claims.

DETAILED DESCRIPTION OF A PREFERRED EMBODIMENT

The present method and system are directed to solving space-time problems involving three-dimensional space. In the prior art, three-dimensional finite element models were solved for a particular point in time. Put another way, the models were three-dimensional instead of four-dimensional. If a solution for the three-dimensional model over time was required, the three-dimensional model was solved for a first time value, then for a second time value, then a third, and so on. Thus, the finite element model was not a continuous four-dimensional model, but was instead a three-dimensional model which was stepped over a given range of time values. Then, the series of three-dimensional solutions to the three-dimensional model could be combined to construct a four-dimensional solution.

The present method and system employ a four-dimensional finite element model to generate a four-dimensional solution. More particularly, an unstructured finite element mesh is generated to model the desired physical system over a desired time span. This four-dimensional model is then solved to generate a four-dimensional solution (a solution for the three-dimensional system over time.) The unstructured four-dimensional finite element model is capable of following irregular spatial and temporal features of the physical system which is being modeled with much greater accuracy than can be achieved using a regular (hexahedral) mesh. The four-dimensional mesh is generated from a three-dimensional mesh by extruding each of the simplices of the three-dimensional mesh in a fourth dimension (time.) The extrusion creates a four-dimensional prism from each of the three-dimensional simplices. These four-dimensional prisms are then divided into several four-dimensional simplices which form a four-dimensional finite element model. The elements of this model can be selectively refined to obtain a finer mesh in areas of greater interest, and a coarser mesh in areas which are of less interest. The mesh can be refined in the spatial dimensions and, unlike time-stepped models, it can also be easily refined in the temporal dimension.

It will be helpful to first define a few terms.

A node is a point in space. In finite element modeling, nodes form the vertices of the elements which are modeled. The nodes also form part of a mesh, where nodes and edges define the boundaries between elements in the modeled space.

An edge is a line between two nodes which form vertices of an element. The edges form part of the mesh which defines the boundaries between elements in the modeled space.

An element is a spatial configuration that encloses space in a given dimension. It is bounded by nodes and edges.

Figure 2:
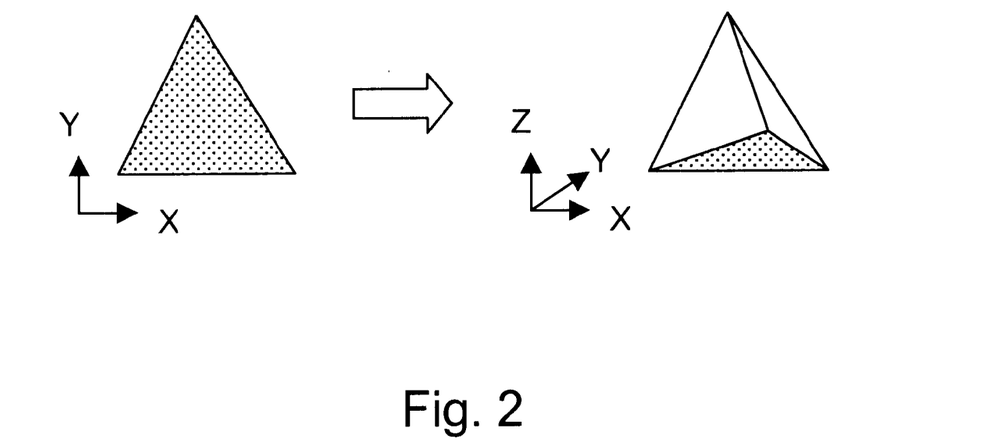
FIG. 2 is an illustration of the triangular and tetrahedral elements which comprise unstructured finite element meshes in the present method.

A simplex is a spatial configuration of n dimensions determined by n+1 points in a space of dimension equal to or greater than n. In other words, a simplex is a geometric spatial element having the minimum number of boundary points necessary to enclose a space in a given number of dimensions. For example, in two dimensions, a simplex comprises a triangle, together with the interior area bounded by the triangle (see FIG. 2.) Two points are insufficient to form a simplex in two-dimensional space because no area is bounded by the points (and the lines which interconnect them.) While four points may be sufficient to bound a two-dimensional area, they do not comprise the minimum number of boundary points by which the two-dimensional area can be bounded. In three dimensions, a simplex comprises a tetrahedron, which is bounded by four vertices (see FIG. 2.) In four dimensions, a simplex comprises a hypertetrahedron (sometimes referred to as a hypertet) having five vertices.

A mesh is a collection of elements that fill a space. These elements are representative of a system which resides in that space. Because each element can be defined by a plurality of nodes and/or the edges between those nodes, a mesh may alternatively be considered a collection of nodes and/or the edges between them. At various points in this disclosure, "mesh" will be used to alternately refer to collections of elements or nodes/edges, depending upon the context in which the term is used. The mesh may also be referred to herein as a finite element model or simply a model.

In the present system and method, a four-dimensional mesh representing a volume to be modeled and a temporal range over which the volume is to be modeled is constructed. The mesh is an unstructured mesh of four-dimensional simplex elements. That is, each element in the mesh is defined by five nodes which form its vertices. The elements are not constrained by the same requirements as structured meshes (e.g., minimum size of elements) and are therefore capable of more closely matching nodes of the elements to points of interest (e.g., object surfaces) and more accurately modeling physical systems.

Figure 3A:
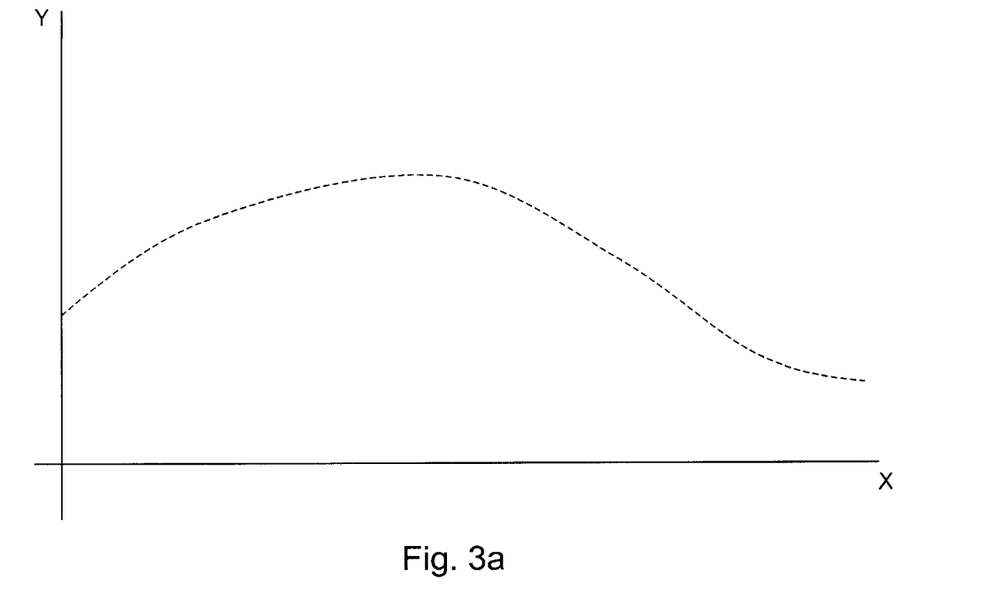
FIGS. 3a–3c are illustrations of a two-dimensional spatial curve and both structured and unstructured meshes that could be used to model the curve.
Figure 3B:
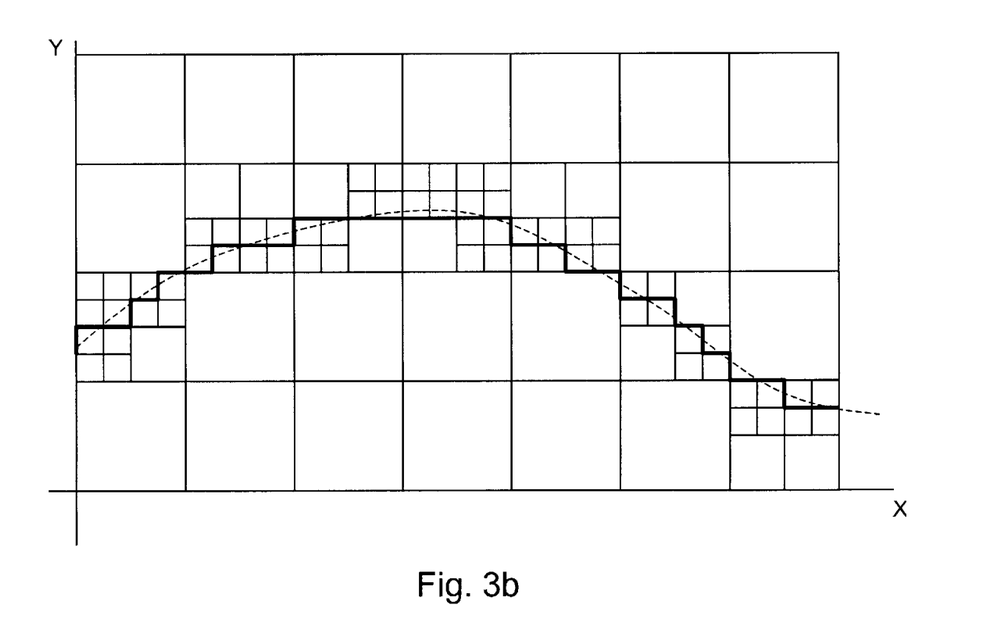
Figure 3C:
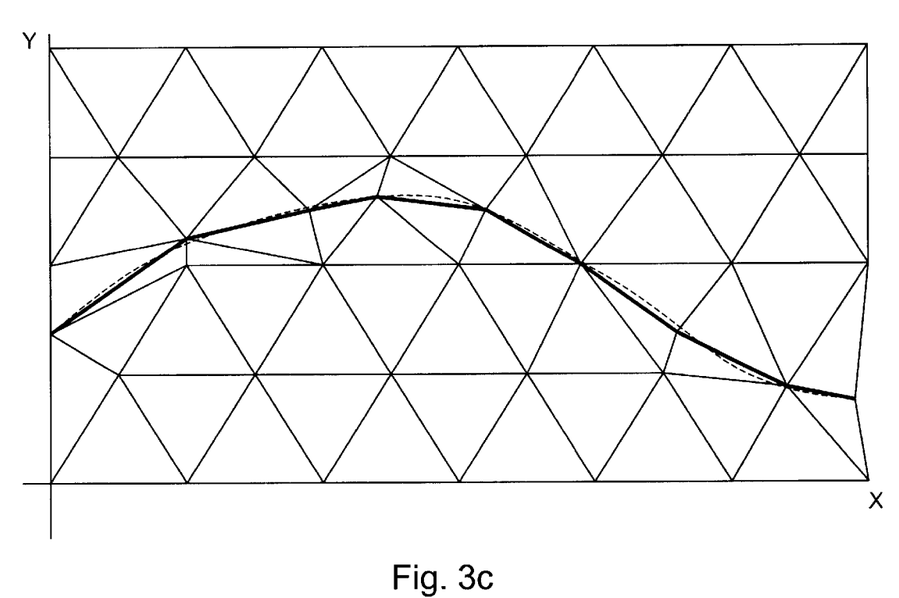

An example is illustrated in FIGS. 3a–3c. FIG. 3a shows a curve which represents a surface in two-dimensional space. FIG. 3b shows a structured two-dimensional mesh which can be constructed to model the surface shown in FIG. 3a. The curve which is to be modeled is also shown in this figure. It can be seen that the elements of the structured mesh are larger in the portions of the mesh which do not touch the curve. Some of the elements in the mesh which are closer to the curve have been broken down into smaller elements. The elements are generally broken down in this manner in order to more accurately model regions around the curve. The accuracy of this representation of the curve, however, is limited because the minimum size of the elements may be limited. Further, regardless of the minimum size of the elements, the elements are all rectangular and consequently cannot follow the varying slope of the curve.

FIG. 3c shows an unstructured two-dimensional mesh that can be constructed to model the curve. It can be seen that this mesh uses two-dimensional simplices (i.e., triangles) rather than rectangular elements. While the mesh shown in this figure also begins with larger elements (i.e., elements whose size is roughly equivalent to the elements of the structured mesh of FIG. 3b,) the elements are not simply subdivided until their nodes become arbitrarily close to the curve, as was the case with the structured mesh. Instead, the nodes of the elements can be shifted (in addition to subdividing the elements, if necessary) so that the nodes are arbitrarily close to the curve. Further, by shifting the nodes to fall on the curve, the edges of the simplices can follow the curve and model it with much more accuracy than the structured mesh (note the heavy line in each of FIGS. 3b and 3c which shows the edges that follow the modeled curve.)

FIGS. 3b and 3c illustrate the improved accuracy with which the unstructured mesh can follow the physical geometry of the system being modeled. It should be noted that this same advantage is also achieved, and may be even more important in the temporal dimension, since it can effectively enable variable time steps. As shown above, both structured and unstructured meshes can, to some extent, resolve smaller spatial features by using a finer mesh in a region of interest. That is, for a selected region of XYZ space, a finer mesh can be used. The unstructured mesh can, however, do essentially the same thing in the temporal dimension, while the structured mesh cannot, when used in the context of prior art time-stepping schemes as described above.

As indicated above, prior art methods do not actually solve a four dimensional model. Instead, a three-dimensional model is solved at each of a collection of time steps. Thus, if increased accuracy is desired in a particular time interval, the entire three-dimensional spatial model must be solved for an increased number of time values (using smaller time steps.) The structured mesh cannot be refined to have a first time step in a in a first spatial region and at the same time have a different time step in a second spatial region. Using the unstructured mesh of the present system and method, however, this is easily achieved.

The usefulness of this capability is illustrated by the following example. If a disturbance such as a pressure wave propagates through a reservoir, it may be desirable to increase the number of elements in the vicinity of the disturbance. Because the disturbance propagates through the reservoir, the location at which the fine mesh is needed changes with time. Presumably, the disturbance will propagate through the entire space which is being modeled, so, at one time or another, each location in the modeled space will need to have an increased number of elements. A structured three-dimensional mesh does not change with time. It is simply time-stepped, with each element in the mesh being advanced by the same interval (size of time step.) Thus, each region in the modeled space must have the maximum number of elements that will be desired at any time. A solution for the model at any given time requires solutions for all of these elements, regardless of whether the additional elements are needed at that time. As a result of the increased number of elements in the mesh, increased computing resources are required to generate a solution.

The present system and method solves this problem by generating a four-dimensional mesh that can be refined for particular regions of both space and time. Just as the two dimensional mesh illustrated in FIG. 3c can be refined to include additional elements in particular areas of X-Y space, the present system and method enable refinement of the four-dimensional mesh to add elements (or even collapse elements) in particular regions of X-Y-Z-time space. Because the mesh can be refined in time as well as space, the mesh need not include in a spatial region the maximum number of elements that will be needed at any time. It can instead include only those elements that will be needed at the appropriate time and space, effectively varying the time step from one spatial region to another. As a result, there are less elements in the mesh corresponding to any given time, and less computing resources are needed to compute a solution for the modeled system.

Figure 4:
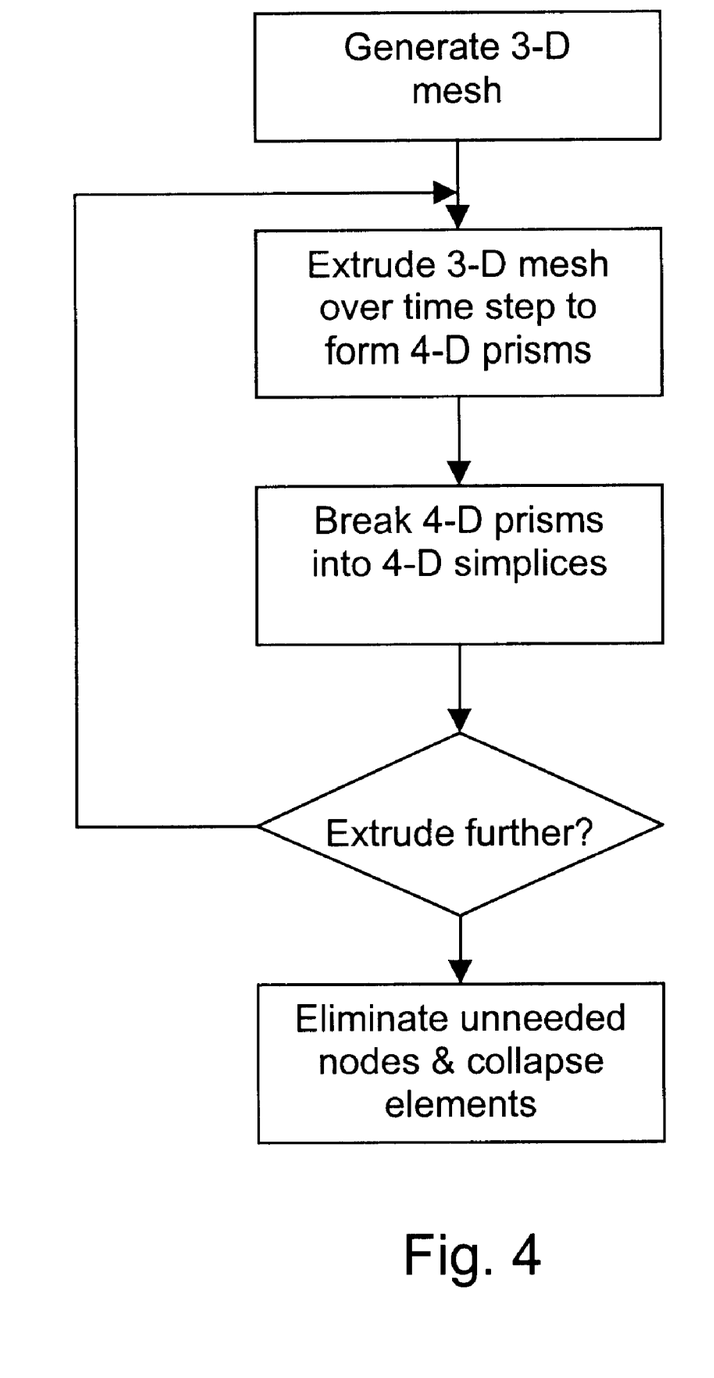
FIG. 4 is a flow diagram illustrating for generating a four-dimensional mesh in one embodiment.

The generation of the four-dimensional mesh can be performed in a number of ways. A description of a preferred method follows. Referring to FIG. 4, a flow diagram illustrating the method is shown. First, an unstructured three-dimensional mesh which is representative of the physical system to be modeled (i.e., a mesh in X-Y-Z space) is generated. This three-dimensional mesh may be generated by any suitable means. This three-dimensional mesh is then extruded in the temporal dimension. (A preferred method of extrusion of the three-dimensional mesh will be described in more detail below.) The three-dimensional mesh is extruded over a certain interval which is equivalent to the minimum time step that would be desired at any region in the three-dimensional mesh during that interval. The minimum time step is driven by both the minimum mesh size and the largest velocity values in the system. The extrusion creates a plurality of four-dimensional prisms, each of which is then broken up into three four-dimensional simplices, creating an unstructured four-dimensional mesh extending over the interval. The extrusion and creation of simplices is then repeated for each succeeding interval over the desired time range for the four-dimensional model. (It should be noted that each successive extrusion is made from the three-dimensional mesh displaced in the previous extrusion, and not from the four-dimensional simplices.) The four-dimensional mesh is then examined to identify regions in which the minimum time step is not necessary (for example, after a disturbance has passed through a region.) Selected nodes in these regions are eliminated, and the elements associated with the eliminated nodes are collapsed into fewer elements. This results in an unstructured four-dimensional mesh which has varying time steps in different regions of the modeled four-dimensional space. (It should be noted that it is also possible to generate a mesh that uses larger time steps and then add nodes in regions of interest, wherein the new nodes are at times which are intermediate to the original time steps.)

Figure 5:
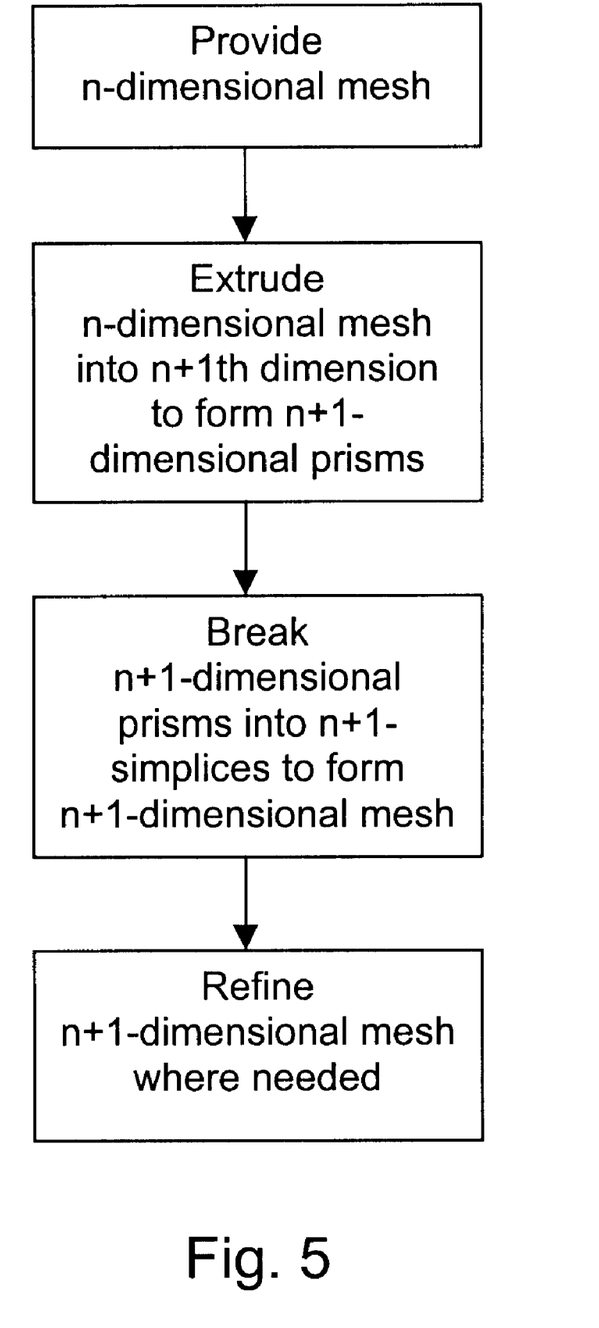
FIG. 5 is a flow diagram illustrating the generation of an n+1-dimensional mesh from an n-dimensional mesh in one embodiment.

As indicated above, the three-dimensional mesh which models the physical region to be modeled can be generated in various ways. In one embodiment, the three-dimensional mesh is generated by extruding a two dimensional (e.g., X-Y) mesh in a third dimension (Z). The generation of the three-dimensional mesh from the two dimensional mesh is performed in essentially the same manner as the generation of the four-dimensional mesh from the three-dimensional mesh. This method can be generalized to any number of dimensions. Referring to FIG. 5, a flow diagram illustrating one embodiment of this method is shown. According to this embodiment, an n-dimensional mesh is provided. This mesh is then extruded into another dimension (the n+1th dimension) to form n+1-dimensional prisms. These n+1-dimensional prisms are then divided into n+1-dimensional simplices, thereby forming an n+1-dimensional mesh. The n+1-dimensional mesh which is created in this manner can then be refined if necessary to add one or more nodes in areas of interest or to eliminate nodes where they are not needed.

The general method of FIG. 5 can be used to extrude a mesh of a given dimension into an additional dimension. For example, a one-dimensional (e.g., X) mesh can be used to form a two-dimensional (e.g., X-Y) mesh, or a mesh in two dimensions (e.g., X and Y) can be extruded into a third dimension (e.g., Z or time.) Thus, a finite element model in two-dimensional space can be used to form in a model in three-dimensional space, or in two-dimensional space-time. In the same manner, a finite element model in three-dimensional space can be extruded to generate a three-dimensional space-time model.

Figure 6A:
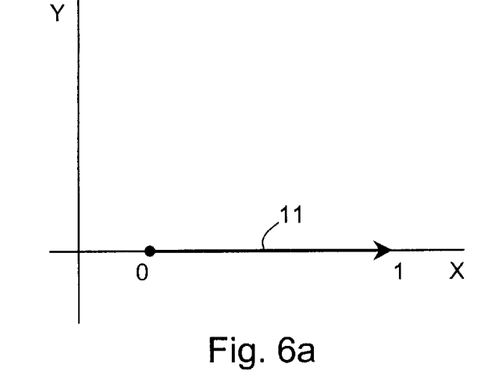
FIGS. 6a–6d are diagrams illustrating the extrusion of a one-dimensional simplex into a pair of two-dimensional simplices in one embodiment.

Referring to FIGS. 6a–6d, a series of drawings illustrating the extrusion of a one-dimensional simplex into a pair of two-dimensional simplices is shown. In FIG. 6a, a one-dimensional simplex 11 comprising nodes 0 and 1 is shown on the X-axis. The line between these nodes comprises the only edge of the simplex.

Figure 6B:
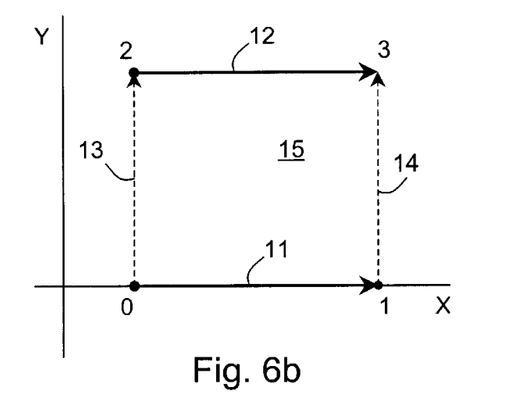

In FIG. 6b, the one-dimensional simplex 11 is extruded in the Y direction. That is, a copy of the simplex is created and is displaced from the original simplex in the Y direction. This copy is indicated by the reference numeral 12. The new one-dimensional simplex 12 comprises nodes 2 and 3 into a single edge extending between them. The two one-dimensional simplices are connected by a pair of edges 13, 14 extending from nodes 0 and 1 to nodes 2 and 3, respectively. Thus, a two-dimensional prism 15 is created by the extrusion of the original one-dimensional simplex 11 in an additional dimension.

Figure 6C:
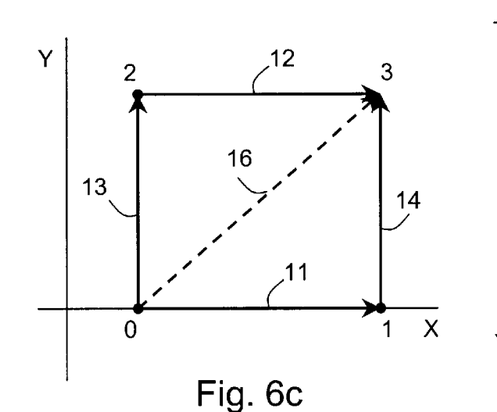
Figure 6D:
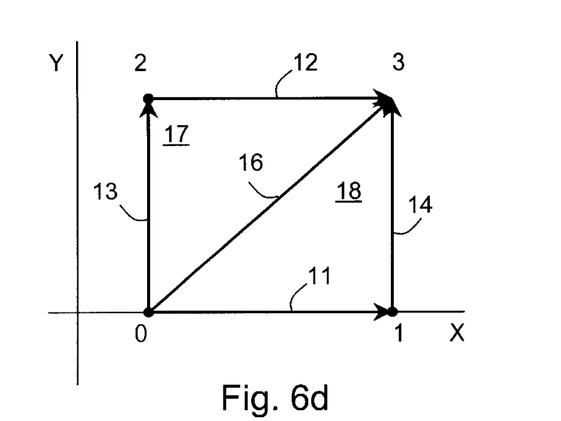

Because the two-dimensional prism which is created by the extrusion of the original one-dimensional simplex 11 is not itself a simplex in two dimensions, it is necessary to divide the prism 15 into two simplices. This is illustrated in FIG. 6c. In this figure, a new edge 16 extending from the node 0 to node 3 is shown. This edge 16 divides the two-dimensional prism 15 into a pair of two-dimensional simplices. These simplices are indicated by the reference numerals 17 and 18 in FIG. 6d.

It should be noted that two-dimensional prism 15 can be divided into two-dimensional simplices in either of two ways: by dividing the prism between nodes 0 and 3, as shown in FIG. 6c; or by dividing the prism between nodes 1 and 2. In the first case, two-dimensional simplices 17 and 18 are created. In the second case, the two-dimensional simplices having the vertices (0, 1, 2) and (1, 2, 3) are created. Both sets of simplices are equally valid. The first set of simplices, however, was chosen in this example because of the particular methodology that was employed. Using this methodology, edge 16 originates at the lower-numbered node of the original one-dimensional simplex and terminates at the opposite node of the two-dimensional prism 15.

Figure 7:
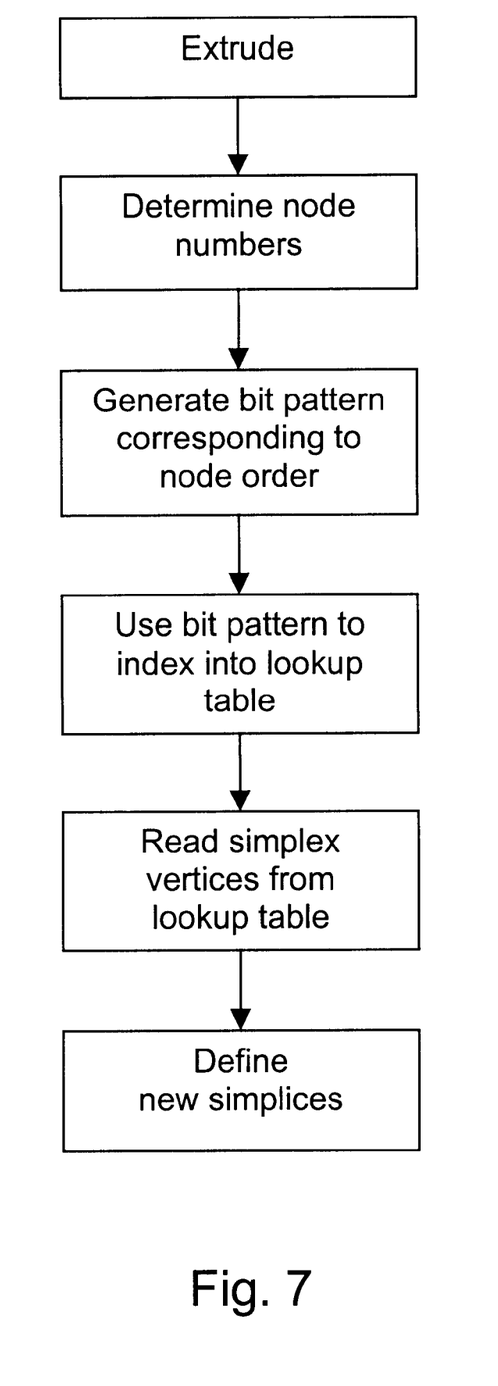
FIG. 7 is a flow diagram illustrating the methodology employed in the creation of the simplices shown in FIG. 6d.

The methodology employed in the creation of simplices 17 and 18 is illustrated in the flow diagram of FIG. 7. Once a prism has been created by extruding a simplex, the node number for each of the nodes in the original simplex is identified. Based upon the ordering of the nodes (i.e., whether the first node is numerically higher or lower than the second node,) a bit pattern is generated. This bit pattern is used as an index to a lookup table that contains the vertices of the new simplices. The selected vertices are then used to define the new simplices.

It may be useful to consider the example of FIG. 6 prior to identification of the node numbers. If it is assumed that nodes 0-3 are initially known only as nodes A–D, and it is assumed that node A is extruded to node C and node B is extruded to node D, then the lookup table might look like Table 1 below. (It should be noted that the first column of table 1 and does not show the bit pattern itself, but instead shows the relationship of A and B which is represented by the bit pattern. In some embodiments, the lookup table contains only the sets of vertices which define the simplices, and the bit pattern is equivalent to the line/entry number of the respective set of vertices.)

TABLE 1

| A < B | {A,C,D}, {A,B,D} |
|---|---|
| A > B | {A,B,C}, {B,C,D} |

In the example of FIG. 6, A=0 and B=1, a bit pattern corresponding to A<B is generated. In one embodiment, this bit pattern could be 0. This bit pattern is used to index into Table 1. Accordingly, the first entry in the table (corresponding to A<B) is selected. The vertices listed in this entry are {A, C, D} and {A, B, D}. Since A–D are equal to 0–3, respectively, in the figure, the new simplices are defined by the vertices {0, 2, 3} and {0, 1, 3}.

If the nodes had been examined in a different order, the same result would be reached. In the example above, node 0 was the "A" node, while node 1 was the "B" node. If this were reversed (i.e., if node 0 was the "B" node, while node 1 was the "A" node,) the same vertices would be selected for the new simplices. If A=1, B=0, C=3 and D=2, then A would have been greater than B, and the second entry in the table (corresponding to A>B) would have been selected. The vertices listed in this entry are {A, B, C} and {B, C, D}. Substituting the node numbers for A–D, the vertices would be {1, 0, 3} and {0, 3, 2}, which are the same vertices which were selected in the first instance.

It can also be seen from this example that, if the node numbers were reversed (i.e., if node 1 were to the left of node 0 on the X axis,) the new simplices would have been selected so that edge 16 extended from the lower, right-hand node to the upper, left-hand node. It should be noted that, in this instance, the new edge would still extend from node 0 to the opposite node of the prism.

Figure 8A:
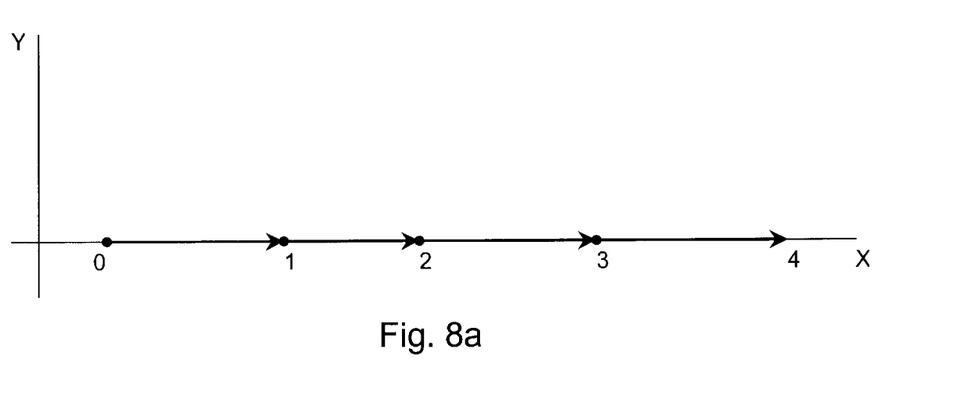
FIGS. 8a–8b are illustrations of the conversion of a one-dimensional mesh to a two-dimensional mesh in one embodiment.
Figure 8B:
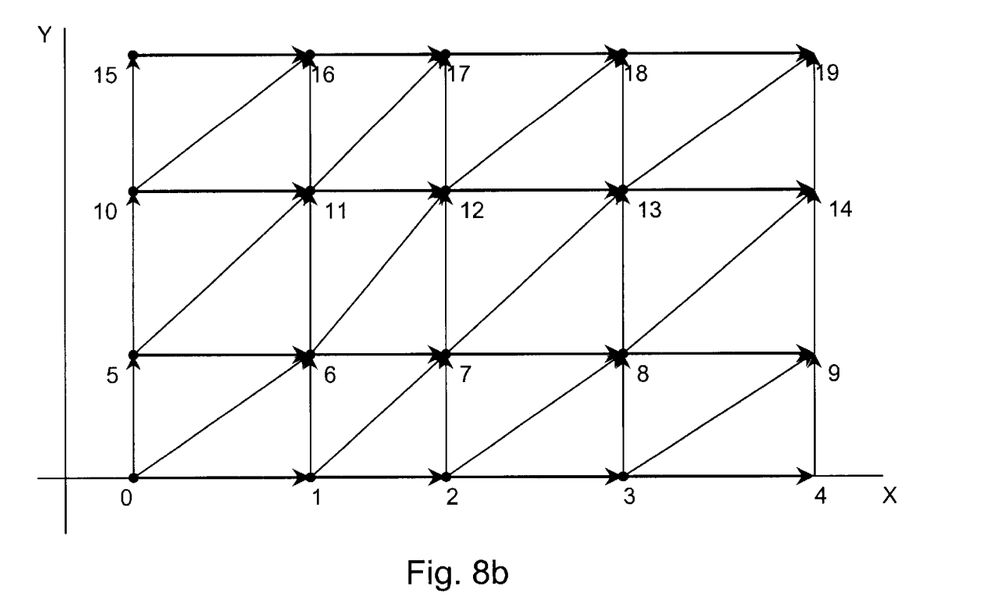

While the example of the FIG. 6 shows the conversion of only a single one-dimensional simplex into a pair of two-dimensional simplices, this method can be used to generate additional two-dimensional simplices based upon the original one-dimensional simplex, or based upon a mesh of one-dimensional simplices. Thus, a one-dimensional mesh as shown in FIG. 8a can be used to generate a mesh of two-dimensional simplices as shown in FIG. 8b.

The method described above for the generation of two-dimensional simplices from one-dimensional simplices can be generalized to n dimensions. That is, it can be used to generate n+1-dimensional simplices from n-dimensional simplices. For example, using this method, a two-dimensional mesh can be used to generate a three-dimensional mesh, or a three-dimensional mesh can be used to generate a four-dimensional mesh. The method is therefore useful in finite element modeling of three-dimensional space, two-dimensional space and time, and three-dimensional space and time.

Figure 9:
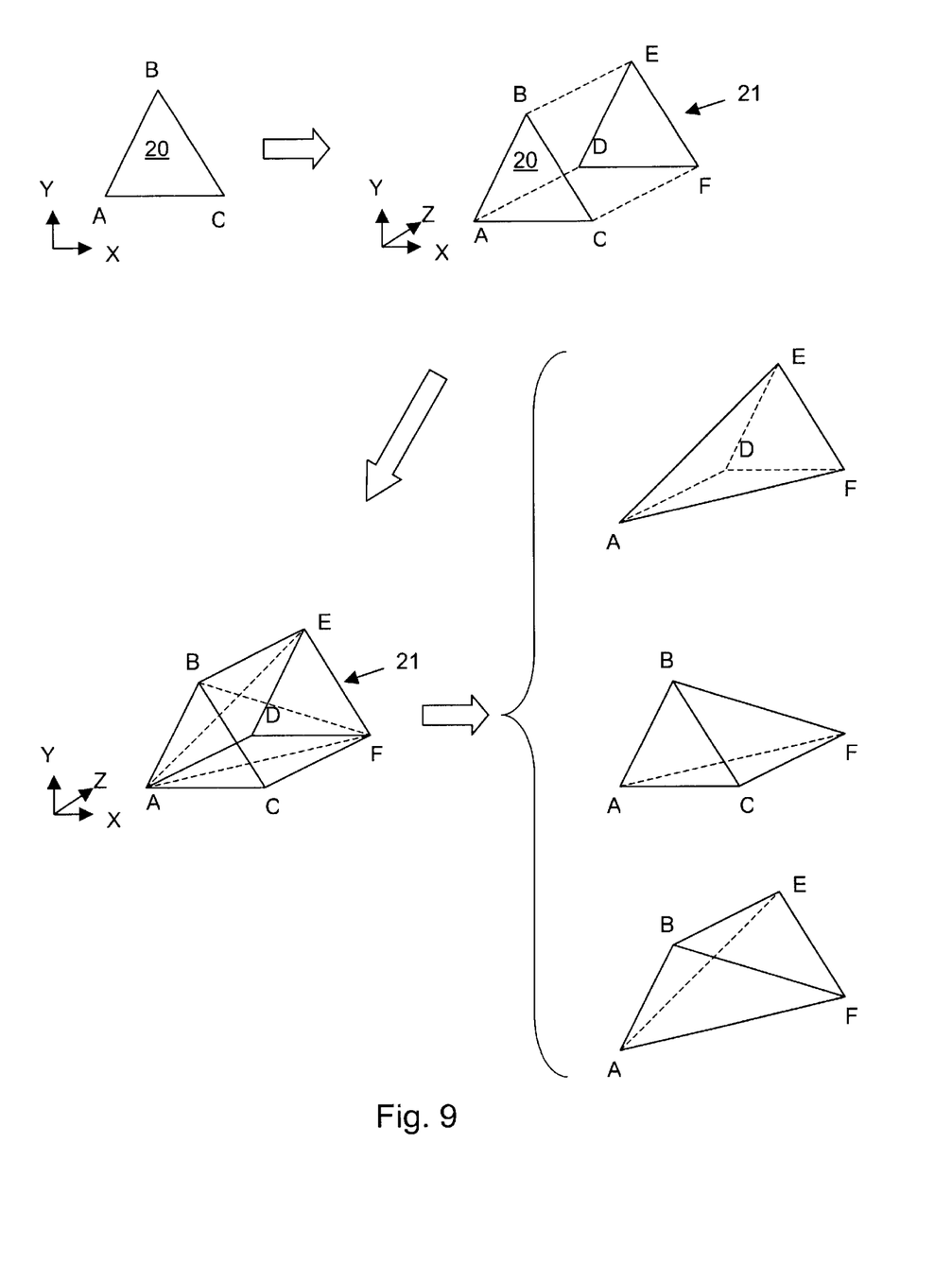
FIG. 9 is an illustration of the conversion of a two-dimensional simplex into three three-dimensional simplices in one embodiment.

Referring to FIG. 9 an example of the generation of three-dimensional simplices from a two-dimensional simplex is illustrated. (The generation of four-dimensional simplices will not be shown here because of the difficulty of graphically representing four dimensions in the drawings.) Triangle 20 is a two-dimensional simplex in the X-Y plane. Triangle 20 is defined by vertices A, B and C. The first step in generating three-dimensional simplices from this two-dimensional simplex is to extrude triangle 20 in the Z direction. Three-dimensional prism 21 is formed by this extrusion. Prism 21 has vertices A, B, C, D, E and F.

The next step in the process is to determine the node numbers associated with each of the vertices of triangle 20 (and/or prism 21.) Based upon the node numbers, a bit pattern is generated. This bit pattern is used to index into a lookup table which contains the sets of vertices corresponding to each possible ordering of the node numbers. It should be noted that the ordering of the node numbers for nodes D, E and F are assumed to be identical to be ordering of the node numbers for nodes A, B and C. Because the node numbers of nodes D, E and F are assigned when prism 21 is extruded from triangle 20, it is a simple matter to ensure that this is true. The bit pattern which is generated based upon the node numbers of triangle 20 (or prism 21) is then used to select the proper entry from the lookup table.

In one embodiment, the lookup table is as shown below in Table 2.

TABLE 2

| 1 | A < B < C | {A,B,C,F}, {A,D,E,F}, {B,A,E,F} |
|---|---|---|
| 2 | B < A < C | {A,B,C,F}, {B,A,D,F}, {E,B,D,F} |
| 3 | unused | {N,N,N,N}, {N,N,N,N}, {N,N,N,N} |
| 4 | B < C < A | {B,C,A,D}, {B,E,F,D}, {C,B,F,D} |
| 5 | A < C < B | {A,C,F,E}, {C,A,B,E}, {D,A,F,E} |
| 6 | unused | {N,N,N,N}, {N,N,N,N}, {N,N,N,N} |
| 7 | C < A < B | {A,C,D,E}, {C,A,B,E}, {C,F,D,E} |
| 8 | C < B < A | {B,C,A,D}, {C,B,E,D}, {F,C,E,D} |

Each entry in table 2 contains three sets of vertices. Each of the sets of vertices defines one of the simplices into which the prism is divided. There are six possible orderings of the three vertices of triangle 20. The possible orderings are: A<B<C; B<C<A; C<A<B; A<C<B; C<B<A; and B<A<C. Each of these orderings has a particular bit pattern associated with it. In the embodiment which implements Table 2, the bit pattern is represented in three bits, so there can be eight possible bit patterns. Consequently, the table contains eight entries corresponding to the possible bit patterns. Two of the entries in table 2 correspond to invalid bit patterns. If either of these bit patterns is generated, an error is indicated.

In one embodiment, a bit shifting scheme is used to generate a bit pattern which is the basis for indexing into the lookup table. It is the use of this particular bit shifting scheme which necessitates the eight-entry table shown above. It should be noted that other means for generating an appropriate bit pattern can be used in other embodiments. Likewise, it is not necessary to generate a bit pattern in other embodiments if another means for indexing into the lookup table is implemented.

Referring again to FIG. 9, if it is assumed that the node numbers for the vertices follow the same ordering as the corresponding letters by which they are identified (i.e., if A<B<C<D<E<F,) then according to the present method, a bit pattern corresponding to A<B<C will be generated. This bit pattern will be used to index into Table 2 and select the first entry (which corresponds to A<B<C.) As defined by this entry, the sets of vertices which define the new three-dimensional simplices are {A, B, C, F}, {A, D, E, F} and {B, A, E, F}.

Prism 21 is shown in the lower, left-hand portion of FIG. 9 with the edges of the new simplices indicated by the dashed lines. The separate three-dimensional simplices are shown on the lower, right hand side of the figure. It can be seen that each one of the new simplices has the four vertices defined by the corresponding one of the sets of vertices included in the first entry of Table 2.

Thus, using the present methodology, a two-dimensional mesh can be converted to a three-dimensional mesh. Just as the present methodology can be extended from the first case described above (generating a two-dimensional mesh from a one-dimensional mesh,) to the second case (generating a three-dimensional mesh from a two-dimensional mesh,) it can be extended to n dimensions. That is, a mesh of dimension n+1 can be generated from a mesh of dimension n. While examples of the generation of meshes of greater than four dimensions will not be given here due to the difficulty of illustrating four-dimensional figures, the methodology is applied in the same manner as described above.

It should be noted that the lookup table which is used to determine the vertices of the simplices in the n+1$^{th}$ dimension will increase rapidly in size. For example, when generating a two-dimensional mesh from a one-dimensional mesh, there are only two possible choices when determining the new, two-dimensional simplices, so only two entries are necessary in the lookup table. When generating a three-dimensional mesh from a two-dimensional mesh, however, there are six possible choices of the new, three-dimensional simplices. In the scheme described above, a table having eight entries is used. When it is desired to generate a four-dimensional mesh from a three-dimensional mesh, there are 24 possible choices for the new, four-dimensional simplices. It is evident that the number of choices is (n+1)!

It should be noted that, because of the particular bit shifting scheme which is employed in the preferred embodiment, the lookup table which contains the vertices of the new, four-dimensional simplices will have 64 entries. Only 24 of the entries in this table will be valid. These entries will correspond to bit patterns associated with the 24 possible permutations of the order of the nodes of the three-dimensional simplex from which the new, four-dimensional simplices are derived. The remaining entries will correspond to invalid bit patterns. If any of these invalid bit patterns is selected, an error will be indicated.

The use of the present methodology provides for extremely fast generation of meshes having an additional dimension. Because the present methodology extrudes the existing mesh (of dimension n) to form a plurality of prisms (of dimension n+1) and then divides these prisms into n+1-dimensional simplices through the use of a lookup table, it is extremely fast. This methodology eliminates the need for a prior art mesher of the type which has previously been necessary to generate a four-dimensional mesh. Consequently, the cost of purchasing a mesher or expending the time and effort to develop code for a mesher is also eliminated. The present methodology therefore effectively enables "free" four-dimensional mesh generation.

While the present invention has been described with reference to particular embodiments, it should be understood that the embodiments are illustrative and that the scope of the invention is not limited to these embodiments. Many variations, modifications, additions and improvements to the embodiments described above are possible. Particularly, these variations may include computer readable media (such as floppy disks, CD-ROMs, DVD-ROMs, etc.,) storage devices, computer memories and the like which contain software, firmware or other programming embodying the foregoing methods. It is contemplated that these variations, modifications, additions and improvements fall within the scope of the invention as detailed within the following claims.

What is claimed is:

1. A method for modeling a three-dimensional system in time comprising:
   providing a three-dimensional mesh, wherein the three-dimensional mesh corresponds to a system to be modeled;
   generating a four-dimensional mesh based from the three-dimensional mesh, wherein the fourth dimension corresponds to a time over which the system is to be modeled, wherein the four-dimensional mesh comprises a plurality of nodes and wherein the plurality of nodes have a plurality of different time values associated therewith; and
   generating a solution the four-dimensional mesh.

2. The method of claim 1 wherein providing the three-dimensional mesh comprises providing a three-dimensional mesh that contains data corresponding to a geological structure.

3. The method of claim 1 wherein the three-dimensional mesh comprises a plurality of three-dimensional simplices in a an unstructured mesh.

4. The method of claim 1 wherein the four-dimensional mesh comprises a plurality of four-dimensional simplices in a an unstructured mesh.

5. The method of claim 1 wherein generating the four-dimensional mesh comprises extruding the three-dimensional mesh in a fourth dimension.

6. The method of claim 5 wherein extruding the three-dimensional mesh in a fourth dimension comprises:
   for each three-dimensional simplex of the three-dimensional mesh,
      creating a four-dimensional prism by extruding the three-dimensional simplex in the fourth dimension, and
      dividing the four-dimensional prism into four four-dimensional simplices.

7. The method of claim 6 wherein dividing the four-dimensional prism into four four-dimensional simplexes comprises identifying the nodes of the four-dimensional prism and defining subsets of the nodes of the four-dimensional prism as vertices of the four-dimensional simplices.

8. The method of claim 7 wherein defining subsets of the nodes of the four-dimensional prism as four-dimensional simplices comprises identifying a node number associated with each of the nodes of the four-dimensional prism, determining a bit pattern based on the node numbers, indexing into a lookup table based on the bit pattern, and reading the vertices of the four-dimensional simplices from the table.

9. The method of claim 1 further comprising collapsing a plurality of simplices in the four-dimensional mesh into a single simplex in the four-dimensional mesh.

10. The method of claim 1 further comprising adding one or more additional nodes to the four-dimensional mesh and creating a plurality of new simplices which include the one or more additional nodes.

11. The method of claim 1 wherein a time step corresponding to a first time represented by the four-dimensional mesh varies across a three-dimensional spatial region of the four-dimensional mesh.

12. The method of claim 1 wherein providing the three-dimensional mesh comprises providing a two dimensional mesh and extruding the two dimensional mesh into the three-dimensional mesh.

13. A computer readable medium having one or more instructions embodied therein, wherein the instructions are configured to cause a computer to:
   convert a three-dimensional mesh to a four-dimensional mesh, wherein the three-dimensional mesh corresponds to a system to be modeled and the four-dimensional mesh corresponds to the system to be modeled over a range of time, wherein the four-dimensional mesh comprises a plurality of nodes and wherein the instructions are configured to cause the computer to associate the plurality of nodes with a plurality of different time values; and
   generate a solution the four-dimensional mesh.

14. The computer readable medium of claim 13 wherein the instructions are configured to cause the computer to read data associated with the three-dimensional mesh.

15. The computer readable medium of claim 13 wherein the three-dimensional mesh comprises a plurality of three-dimensional simplices in a an unstructured mesh.

16. The computer readable medium of claim 13 wherein the four-dimensional mesh comprises a plurality of four-dimensional simplices in a an unstructured mesh.

17. The computer readable medium of claim 13 wherein the instructions are configured to cause the computer to generate the four-dimensional mesh by extruding the three-dimensional mesh in a fourth dimension.

18. The computer readable medium of claim 17 wherein extruding the three-dimensional mesh in a fourth dimension comprises:
for each three-dimensional simplex of the three-dimensional mesh,
creating a four-dimensional prism by extruding the three-dimensional simplex in the fourth dimension, and
dividing the four-dimensional prism into four four-dimensional simplices.

19. The computer readable medium of claim 18 wherein dividing the four-dimensional prism into four four-dimensional simplexes comprises identifying the nodes of the four-dimensional prism and defining subsets of the nodes of the four-dimensional prism as vertices of the four-dimensional simplices.

20. The computer readable medium of claim 19 wherein defining subsets of the nodes of the four-dimensional prism as four-dimensional simplices comprises identifying a node number associated with each of the nodes of the four-dimensional prism, determining a bit pattern based on the node numbers, indexing into a lookup table based on the bit pattern, and reading the vertices of the four-dimensional simplices from the table.

21. The computer readable medium of claim 13 wherein the instructions are further configured to cause the computer to collapse a plurality of simplices in the four-dimensional mesh into a single simplex in the four-dimensional mesh.

22. The computer readable medium of claim 13 wherein the instructions are further configured to cause the computer to add one or more additional nodes to the four-dimensional mesh and create a plurality of new simplices which include the one or more additional nodes.

23. The computer readable medium of claim 13 wherein a time step corresponding to a first time represented by the four-dimensional mesh varies across a three-dimensional spatial region of the four-dimensional mesh.

24. The computer readable medium of claim 13 wherein the instructions are configured to cause the computer to generate the three-dimensional mesh by extruding a two dimensional mesh into the three-dimensional mesh.

25. A method for generating a second mesh of dimension n+1 from a first mesh of dimension n, wherein each mesh includes a plurality of simplices, the method comprising:
for each n-simplex of the first mesh,
creating an (n+1)-prism by extruding the simplex in the $n+1^{th}$ dimension, and
dividing the (n+1)-prism into n+1 (n+1)-simplices.

26. The method of claim 25 wherein extruding the simplex in the $n+1^{th}$ dimension comprises duplicating the original simplex, displacing the duplicate simplex from the original simplex in the $n+1^{th}$ dimension, and defining an edge between each node of the original simplex and the corresponding node of the duplicate simplex.

27. The method of claim 25 wherein dividing the (n+1)-prism into n+1 (n+1)-simplexes comprises identifying the nodes of the (n+1)-prism and defining subsets of the nodes of the (n+1)-prism as vertices of the (n+1)-simplices.

28. The method of claim 27 wherein defining subsets of the nodes of the (n+1)-prism as (n+1)-simplices comprises identifying a node number associated with each of the nodes of the (n+1)-prism, determining a bit pattern based on the node numbers, indexing into a lookup table based on the bit pattern, and reading the vertices of the (n+1) simplices from the table.

29. A computer readable medium having one or more instructions embodied therein, wherein the instructions are configured to cause a computer to:
generate a second mesh of dimension n+1 from a first mesh of dimension n, wherein
each mesh includes a plurality of simplices, and wherein for each n-simplex of the first mesh,
an (n+1)-prism is created by extruding the simplex in the $n+1^{th}$ dimension, and
the (n+1)-prism is divided into n+1 (n+1)-simplices.

30. The computer readable medium of claim 29 wherein extruding the simplex in the $n+1^{th}$ dimension comprises duplicating the original simplex, displacing the duplicate simplex from the original simplex in the $n+1^{th}$ dimension, and defining an edge between each node of the original simplex and the corresponding node of the duplicate simplex.

31. The computer readable medium of claim 29 wherein dividing the (n+1)-prism into n+1 (n+1)-simplexes comprises identifying the nodes of the (n+1)-prism and defining subsets of the nodes of the (n+1)-prism as vertices of the (n+1)-simplices.

32. The computer readable medium of claim 31 wherein defining subsets of the nodes of the (n+1)-prism as (n+1)-simplices comprises identifying a node number associated with each of the nodes of the (n+1)-prism, determining a bit pattern based on the node numbers, indexing into a lookup table based on the bit pattern, and reading the vertices of the (n+1) simplices from the table.

* * * * *